United States Patent
Nishihara et al.

(10) Patent No.: US 9,071,225 B2
(45) Date of Patent: Jun. 30, 2015

(54) ELECTRONIC CIRCUIT AND ELECTRONIC MODULE

(75) Inventors: Tokihiro Nishihara, Tokyo (JP); Shinji Taniguchi, Tokyo (JP); Tsuyoshi Yokoyama, Tokyo (JP); Masanori Ueda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 354 days.

(21) Appl. No.: 13/485,688

(22) Filed: May 31, 2012

(65) Prior Publication Data
US 2012/0306591 A1 Dec. 6, 2012

(30) Foreign Application Priority Data
Jun. 1, 2011 (JP) .................. 2011-123452

(51) Int. Cl.
| H03H 9/70 | (2006.01) |
| H03H 9/72 | (2006.01) |
| H03H 9/17 | (2006.01) |
| H03H 9/205 | (2006.01) |
| H03H 9/54 | (2006.01) |

(52) U.S. Cl.
CPC ............... *H03H 9/173* (2013.01); *H03H 9/205* (2013.01); *H03H 9/542* (2013.01); *H03H 9/706* (2013.01); *H03H 9/725* (2013.01)

(58) Field of Classification Search
CPC ............. H03H 9/54; H03H 9/68; H03H 9/70; H03H 9/706; H03H 9/725; H03H 9/173; H03H 9/205; H03H 9/542
USPC ........ 333/126, 129, 132, 133; 455/78–80, 82, 455/83, 19, 59, 63.1, 500, 501, 524, 525, 455/552.1, 553.1
See application file for complete search history.

(56) References Cited

U.S. PATENT DOCUMENTS

| 6,658,263 | B1 * | 12/2003 | Ke et al. ................... | 455/524 |
| 6,662,021 | B2 * | 12/2003 | Kang et al. .............. | 455/553.1 |
| 6,973,307 | B2 * | 12/2005 | Forrester ................ | 455/426.1 |

(Continued)

FOREIGN PATENT DOCUMENTS

| CN | 101297481 A | 10/2008 |
| JP | 2007-525857 A | 9/2007 |

(Continued)

OTHER PUBLICATIONS

Chinese Office Action dated Jul. 21, 2014, in a counterpart Chinese patent application No. 201210177224.0.

(Continued)

*Primary Examiner* — Barbara Summons
(74) *Attorney, Agent, or Firm* — Chen Yoshimura LLP

(57) ABSTRACT

An electronic circuit includes a plurality of duplexers that are coupled to an antenna terminal and have a pass band different from each other and a plurality of acoustic wave filters that are respectively coupled between the antenna terminal and the plurality of the duplexers, wherein filter characteristics of a first acoustic wave filter of the plurality of the acoustic wave filters are set so as to allow passage of a signal in both a pass band for transmitting and a pass band for receiving of a first duplexer of the plurality of the duplexers that is coupled to the first acoustic wave filter and suppress passage of a signal in both a pass band for transmitting and a pass band for receiving of a second duplexer of the plurality of the duplexers that is different from the first duplexer.

13 Claims, 12 Drawing Sheets

(56) References Cited

U.S. PATENT DOCUMENTS

| | | | |
|---|---|---|---|
| 6,980,067 B2 * | 12/2005 | Forrester et al. | 333/133 |
| 7,102,460 B2 * | 9/2006 | Schmidhammer et al. | 333/133 |
| 7,126,440 B2 * | 10/2006 | Bradley et al. | 333/133 |
| 7,376,440 B2 * | 5/2008 | Forrester et al. | 455/553.1 |
| 2004/0209590 A1 | 10/2004 | Forrester et al. | |
| 2008/0169886 A1 | 7/2008 | Kuroda | |
| 2008/0258845 A1 | 10/2008 | Schmidhammer | |
| 2008/0296529 A1 | 12/2008 | Akiyama et al. | |
| 2009/0009262 A1 * | 1/2009 | Schmidhammer et al. | 333/133 |
| 2009/0256650 A1 | 10/2009 | Cathelin et al. | |
| 2010/0135193 A1 | 6/2010 | Przadka | |
| 2011/0109196 A1 | 5/2011 | Goto et al. | |
| 2012/0050236 A1 * | 3/2012 | Lo et al. | 345/204 |
| 2012/0176206 A1 | 7/2012 | Inoue et al. | |
| 2012/0293278 A1 * | 11/2012 | Burak et al. | 333/189 |

FOREIGN PATENT DOCUMENTS

| | | |
|---|---|---|
| JP | 2008-507869 A | 3/2008 |
| JP | 2009-010926 A | 1/2009 |
| JP | 2009-194915 A | 8/2009 |
| JP | 2010-528498 A | 8/2010 |
| JP | 2011-71874 A | 4/2011 |
| WO | 2010/004741 A1 | 1/2010 |

OTHER PUBLICATIONS

Japanese Office Action dated Mar. 17, 2015 in a counterpart Japanese patent application No. 2011-123452.

Chinese Office Action dated Mar. 17, 2015 in a counterpart Chinese patent application No. 201210177224.0.

Japanese Office Action dated Dec. 24, 2014 in a counterpart Japanese patent application No. 2011-123452.

\* cited by examiner ical journal, Vol. 18, No. 2, p 12 to p 21 describes Carrier Aggregation (CA) technology for communicating with use of a plurality of carriers having a different frequency band as a method of improving the transmission rate. A combination of 800 MHz and 2 GHz may be used as the frequency band used for the Carrier Aggregation. A combination of other various frequency bands may be used.

ELECTRONIC CIRCUIT AND ELECTRONIC MODULE

CROSS-REFERENCE TO RELATED APPLICATION

This application is based upon and claims the benefit of priority of the prior Japanese Patent Application No. 2011-123452, filed on Jun. 1, 2011, the entire contents of which are incorporated herein by reference.

FIELD

A certain aspect of the present invention relates to an electronic circuit and an electronic module.

BACKGROUND

There is a demand for improving a transmission rate of a wireless communication for a purpose of satisfying increased traffic, in a field of a mobile communication system such as a mobile phone. NTT DOCOMO technical journal, Vol. 18, No. 2, p 12 to p 21 describes Carrier Aggregation (CA) technology for communicating with use of a plurality of carriers having a different frequency band as a method of improving the transmission rate. A combination of 800 MHz and 2 GHz may be used as the frequency band used for the Carrier Aggregation. A combination of other various frequency bands may be used.

In a high frequency circuit for transmitting and receiving in the CA, a duplexer allowing passage of a signal in a specific pass band is provided between a common antenna terminal and each of internal terminals (a receiving terminal or a transmitting terminal). A plurality of duplexers are provided so as to cover different frequency bands. A diplexer is provided between the antenna terminal and each of the duplexers. The diplexer has characteristics in which a low pass filter and a high pass filter are combined, and acts as a filter for restraining mixing of a signal (for example, 2 GHz) in a signal path (for example, 800 MHz). The diplexer may be a lumped constant type in which an inductor and a capacitor are combined or a distributed constant type in which a λ/4 line is provided.

In a high frequency wave circuit for transmitting and receiving in the conventional CA, a diplexer is provided between an antenna terminal and each duplexer. However, it is difficult to downsize the diplexer, and the diplexer has relatively large insertion loss. Skirt characteristics of an attenuation curve of the diplexer are not precipitous. Sufficient signal suppression may not be secured in the frequency bands, when the frequency bands used for the Carrier Aggregation are close to each other.

SUMMARY OF THE INVENTION

According to an aspect of the present invention, there is provided an electronic circuit including a plurality of duplexers that are coupled to an antenna terminal and have a pass band different from each other and a plurality of acoustic wave filters that are respectively coupled between the antenna terminal and the plurality of the duplexers, wherein filter characteristics of a first acoustic wave filter of the plurality of the acoustic wave filters are set so as to allow passage of a signal in both a pass band for transmitting and a pass band for receiving of a first duplexer of the plurality of the duplexers that is coupled to the first acoustic wave filter and suppress passage of a signal in both a pass band for transmitting and a pass band for receiving of a second duplexer of the plurality of the duplexers that is different from the first duplexer.

DETAILED DESCRIPTION

Figure 1:
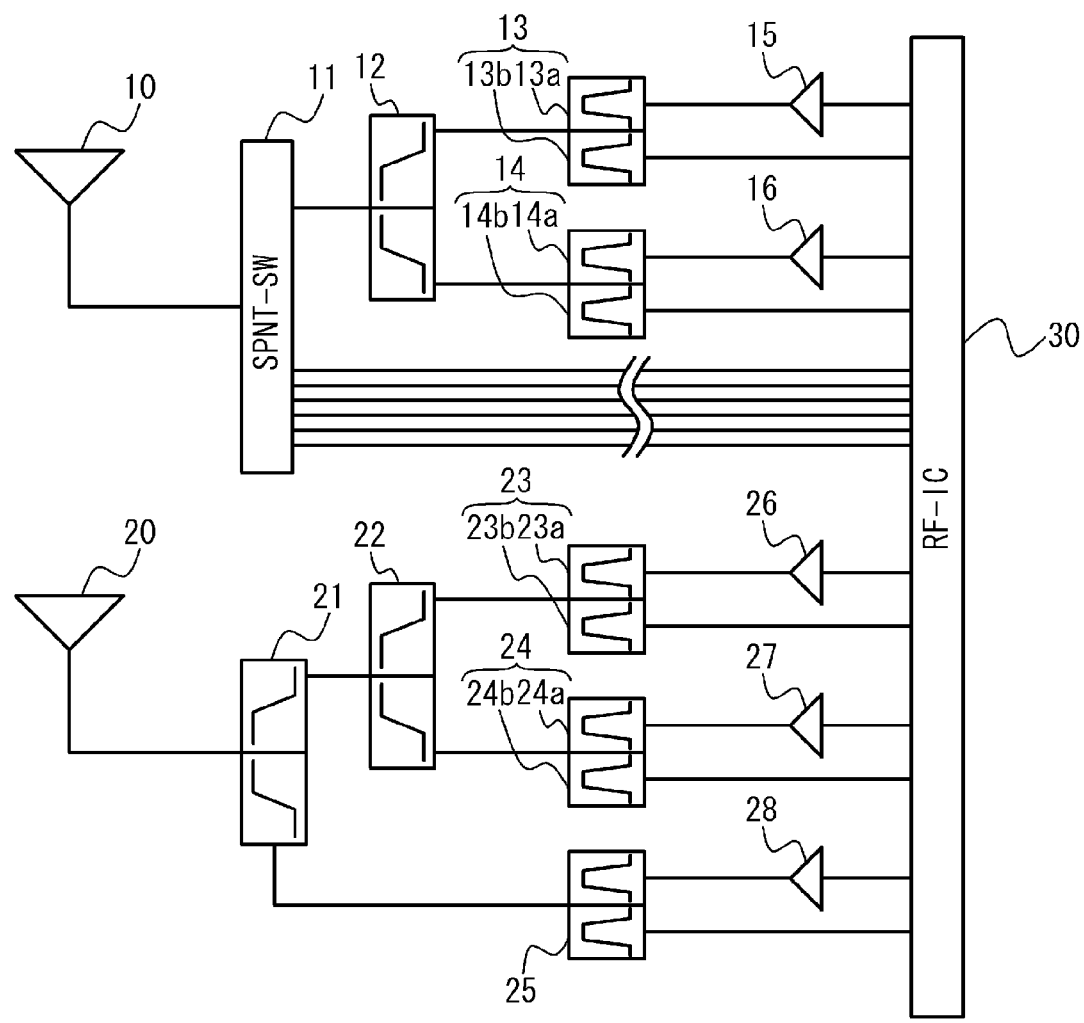
FIG. 1 illustrates a block diagram of an electronic module in accordance with a comparative example.

FIG. 1 illustrates a block diagram of an electronic module in accordance with a comparative example. The electronic module has two antenna terminals (a first antenna terminal 10 and a second antenna terminal 20) and an internal circuit 30 processing a signal that is input or output through the antenna terminals. A filter circuit constituted of a diplexer and a duplexer is provided on each signal path between the antenna terminals 10 and 20 and the internal circuit 30.

A switch 11 is coupled to the first antenna terminal 10. The switch 11 is an SPNT-SW (Single pole N throw) switch having a structure of one terminal to multiple terminals. The switch 11 selects one of signal paths and outputs a signal from the first antenna terminal 10 via the selected signal path, and outputs a signal from the signal paths to the first antenna terminal 10. One of the signal paths from the switch 11 is coupled to a diplexer 12. The others are coupled to the internal circuit 30 via a circuit that is not illustrated. The internal circuit 30 converts a high frequency wave signal input from the antenna terminal into a base band signal by down-converting the high frequency wave signal with a low noise amplifier therein (not illustrated). And, the internal circuit 30 converts a base band for transmitting to a high frequency wave signal to be output from the antenna terminal by up-converting the base band for transmitting.

The diplexer 12 has a structure in which a high pass filter and a low pass filter are combined, divides a signal from the switch 11 into two signal components (high frequency side and low frequency side) and outputs them, and outputs a signal from the internal circuit 30 side to the switch 11. The diplexer 12 may be a lumped constant type forming an inductor and a capacitor or a distributed constant type forming a λ/4 line.

A duplexer 13 and another duplexer 14 are respectively coupled to two signal paths from the diplexer 12. The duplexers 13 and 14 have a structure in which two band pass filters (13a and 13b, or 14a and 14b) are combined. The band pass filters 13a and 14a on the side of transmitting allow passage of a signal having a specific frequency band of the signals input from the internal circuit 30, and outputs the signal having passed the band pass filters 13a and 14a to the antenna side. The band pass filters 13b and 14b on the side of receiving allow passage of a signal having a specific frequency band of the signals input from the diplexer 12, and outputs the signal having passed the band pass filters 13b and 14b to the internal circuit 30. The band pass filters restrain that a signal for transmitting mixes in a signal path for receiving and restrain that a signal for receiving mixes in a signal path for transmitting. The band pass filters structuring the duplexers 13 and 14 may be a filter having a structure in which FBAR (Film Bulk Acoustic Resonator) or SAW (Surface Acoustic Wave) resonators are combined into a ladder type.

The duplexers 13 and 14 are respectively coupled to the internal circuit 30 via two signal lines. One of the two signal paths transmits a signal for transmitting. The other transmits a signal for receiving. Power amplifiers 15 and 16 for amplifying a signal are respectively provided on signal paths coupled to the band pass filters 13a and 14a on the side of transmitting.

The second antenna terminal 20 is coupled to a front diplexer 21. The diplexer 21 divides a signal from the second antenna terminal 20 into two signal paths and outputs the divided signals to the internal circuit 30 side, and outputs a signal from the internal circuit 30 to the second antenna terminal 20. One of the two signal paths on the side of the internal circuit 30 coupled to the diplexer 21 is coupled to the diplexer 22. The other is coupled to the duplexer 25. The duplexers 23, 24 and 25 the diplexers 21 and 22 in the filter circuit on the side of the second antenna terminal 20 have the same structure as the duplexers 13 and 14 and the diplexer 12 in the filter circuit on the side of the first antenna terminal 10.

The duplexers 23 and 24 are coupled to two signal paths from the latter diplexer 22. The duplexers 23 and 24 respectively have a structure in which two band pass filters (23a and 23b, and 24a and 24b) are combined. The band pass filters 23a and 24a on the side of transmitting allow passage of a signal of a specific frequency band of the signals input from the internal circuit 30, and outputs the signal having passed the band pass filters 23a and 24a to the antenna side. The band pass filters 23b and 24b on the side of receiving allow passage of a signal of a specific frequency band of the signals input from the diplexer 21, and outputs the signal having passed the band pass filters 23b and 24b to the internal circuit 30. The band pass filters restrain that a signal for transmitting mixes in a signal path for receiving and restrain that a signal for receiving mixes in a signal path for transmitting. The band pass filters structuring the duplexers 23 and 24 may be a filter having a structure in which FBAR or SAW resonators are combined into a ladder type.

The duplexers 23 and 24 are respectively coupled to the internal circuit 30 via two signal paths. One of the two signal paths transmits a signal for transmitting. The other transmits a signal for receiving. Power amplifiers 26 and 27 for amplifying a signal are respectively provided on signal paths coupled to the band pass filters 23a and 24a on the side of transmitting. The duplexer 25 coupled to the front diplexer 21 is coupled to the internal circuit 30 via two signal paths. A power amplifier 28 is provided on a signal path coupled to a band pass filter 25a on the side of transmitting.

As illustrated in FIG. 1, in the comparative example, a diplexer is inserted between an antenna terminal and a duplexer. For example, the diplexer 22 is coupled in front of (on the side of antenna terminal) the duplexers 23 and 24, in the circuit on the side of the second antenna terminal 20. As mentioned above, a diplexer is constituted of laminated ceramics. Therefore, it is difficult to reduce the height and the size of the diplexer. When the diplexer is inserted, signal loss (for example, 0.5 dB) may be generated (for example, a combination of 800 MHz and 2 GHz). Further, a Q value of the diplexer is small, and skirt characteristics (attenuation characteristics) are not precipitous. When an interval between two frequency bands used for Carrier Aggregation is small (for example, the combination of 1.5 GHz and 2 GHz), it is difficult to secure sufficient suppression in the two frequency bands. In order to secure sufficient suppression, the number of the inductor and the capacitor has to be two or more. In this case, loss of a pass band may be increased as a tradeoff. A description will be given of an electronic circuit for solving the above-mentioned problem.

First Embodiment

Figure 2:
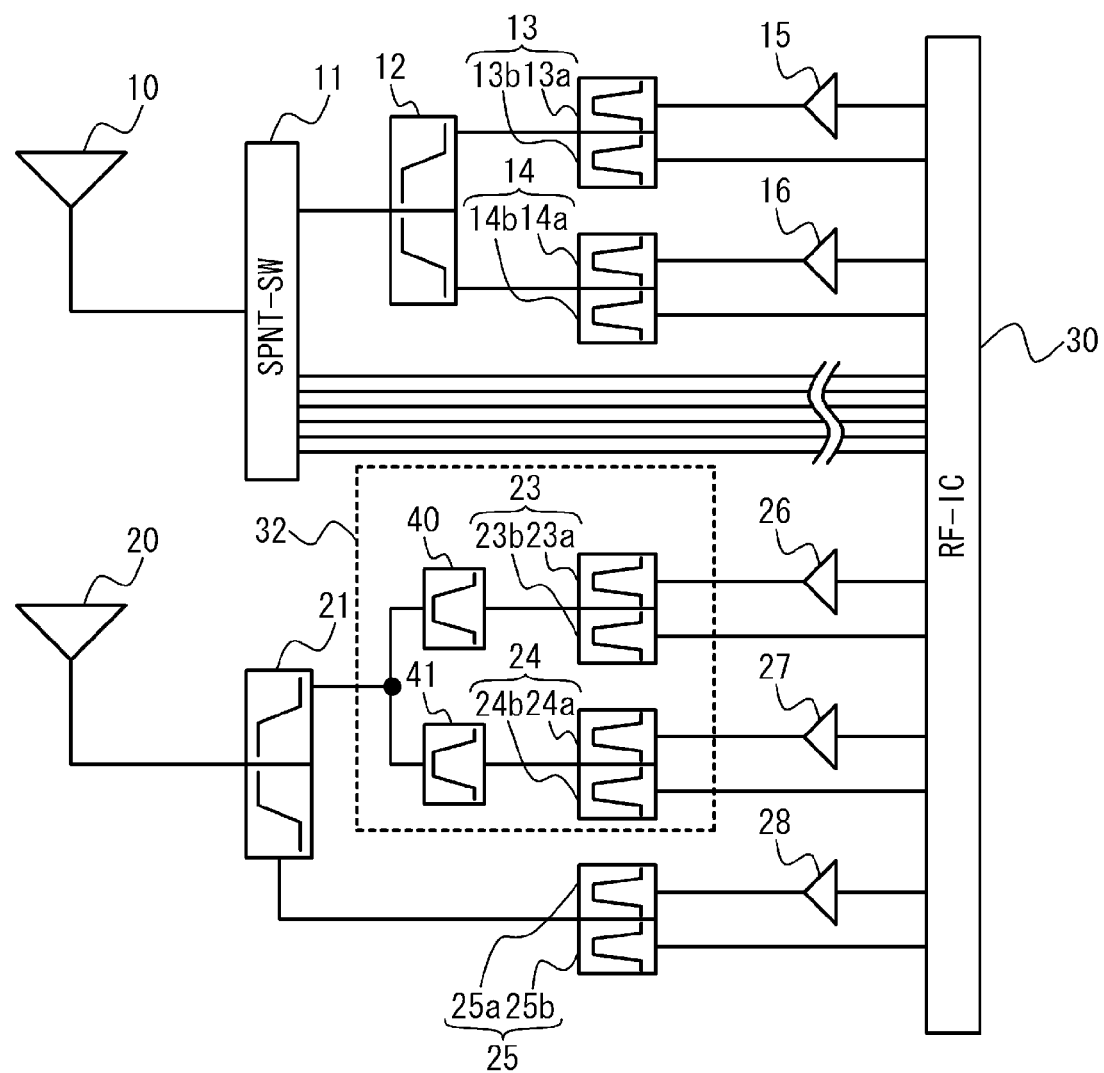
FIG. 2 illustrates a block diagram of an electronic module in accordance with a first embodiment.

FIG. 2 illustrates a block diagram of an electronic module in accordance with a first embodiment. Being different from the comparative example (FIG. 1), acoustic wave filters 40 and 41 are provided in a region 32 instead of the diplexer 22. In concrete, an output of the diplexer 21 is divided into two signal paths. One of the two signal paths is coupled to the acoustic wave filter 40. The other is coupled to the acoustic wave filter 41. A signal path from the acoustic wave filter 40 is coupled to the duplexer 23. A signal path from the acoustic wave filter 41 is coupled to the duplexer 24. The acoustic wave filters 40 and 41 are a filter having a band width for allowing passage of a transmitting frequency and a receiving frequency of the latter duplexer. It is difficult to establish the structure with a surface acoustic wave device (SAW). In the embodiment, two duplexers are provided. However, the number of the duplexer may be three or more.

The duplexer 23 may be a duplexer for Band 8 in 800 MHz band (transmit band: 880 to 915 MHz, receive band: 925 to 960 MHz). The duplexer 24 may be a duplexer for Band 2 in 2 GHz band (transmit band: 1850 to 1910 MHz, receive band: 1930 to 1990 MHz). This allows the region 32 having lower loss by 0.2 to 0.4 dB than the filter of the comparative example. And Carrier Aggregation using a different frequency band (Band 8 and Band 2) is established. When the combination of 1.5 GHz and 2 GHz of which frequency interval is smaller is used in the embodiment, the region 32 achieving low loss and sufficient suppression in the frequency bands is structured. And, Carrier Aggregation in which narrow frequency bands are combined is established.

Figure 3:
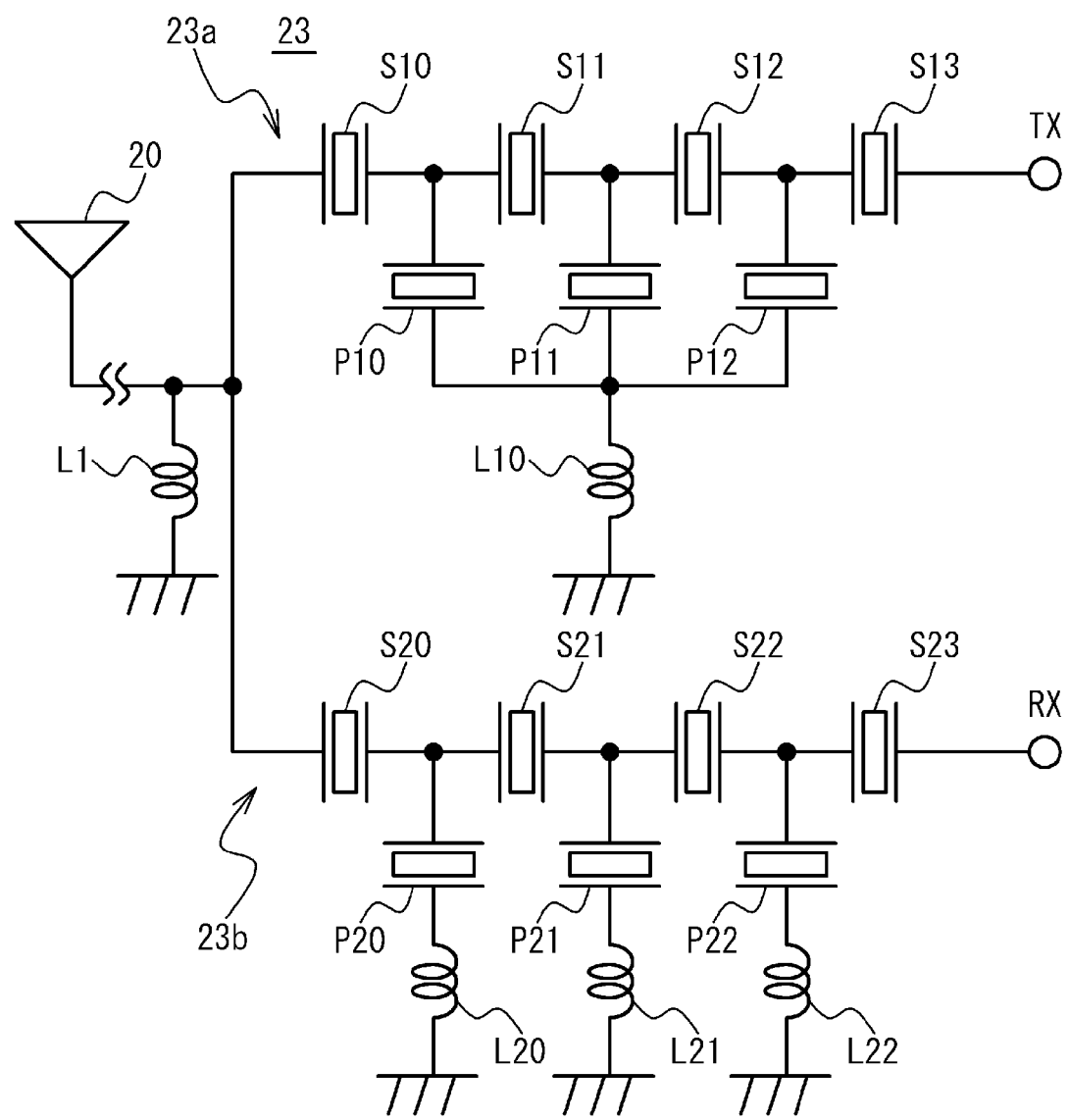
FIG. 3 illustrates a circuit diagram of a duplexer.

FIG. 3 illustrates a circuit diagram of a duplexer illustrated in FIG. 2. A description is given of the structure of the duplexer 23. The diplexer 21 and the acoustic wave filter 40 between the duplexer 23 and the second antenna terminal 20 is omitted. The duplexer 23 includes ladder filters 23a and 23b coupled to a transmitting terminal Tx and a receiving terminal Rx respectively.

A ladder filter 23a on the side of transmitting includes series resonators S10 through S13 between the antenna terminal 20 and the transmitting terminal TX and parallel resonators P10 through P12 coupled between each series resonator. An edge of the parallel resonators P10 through P12 is grounded via a common inductor L10.

A ladder filter 23b on the side of receiving includes series resonators S20 through S23 between the antenna terminal 20 and the receiving terminal RX and parallel resonators P20 through P22 coupled between each series resonator. An edge of the parallel resonators P20 through P22 is grounded via each of inductors L20 through L22. The duplexer 24 has the same circuit diagram as the duplexer 23 (illustrated in FIG. 5).

A matching circuit is provided between the ladder filters 23a and 23b and the antenna terminal 20. In the embodiment, the matching circuit is structured with the inductor L1 of which one of the edges is grounded. The inductor L1 is an inductor L2 and an inductor L3 in FIG. 5. The inductor L1 has the same function as the inductor L2 or the inductor L3.

Figure 4:
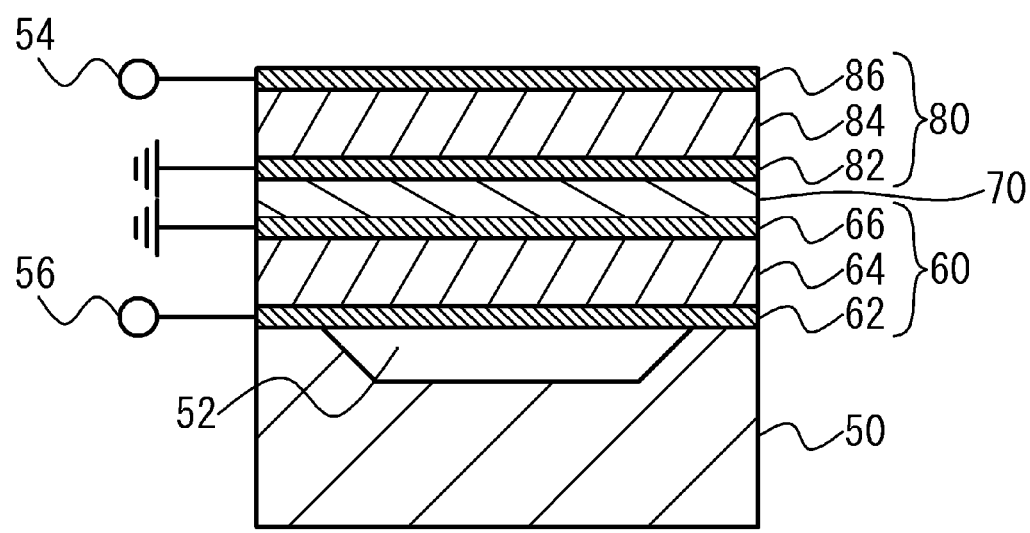
FIG. 4 illustrates a schematic cross sectional view of an acoustic wave filter.

FIG. 4 illustrates a schematic cross sectional view of the acoustic wave filters 40 and 41 illustrated in FIG. 2. A double mode type acoustic wave filter having a CRF (Coupled Resonator Filter) structure is used for the acoustic wave filters 40 and 41. That is, the acoustic wave filter 40 has a structure in which a first resonator 60 and a second resonator 80 acting as a FBAR (Film Bulk Acoustic Resonator) sandwiches a de-coupler film 70 and are laminated on a substrate 50. The first resonator 60 includes a lower electrode 62, a piezoelectric thin film 64 and an upper electrode 66. The second resonator 80 includes a lower electrode 82, a piezoelectric thin film 84 and an upper electrode 86. A void 52 is formed between the lower electrode 62 of the first resonator 60 and the substrate 50.

The lower electrode 62 of the first resonator 60 is coupled to a first terminal 56. An upper electrode 86 of the second resonator 80 is coupled to a second terminal 54. The upper electrode 66 of the first resonator 60 and the lower electrode 82 of the second resonator 80 are grounded in common.

The piezoelectric thin films 64 and 84 may be a material in which an element increasing piezoelectric constant (alkali earth metal such as scandium (Sc) or a rare earth metal such as erbium (Er)) is doped into AlN. PZT (Lead Zirconate Titanate) or BST (Barium Strontium Titanate) having a piezoelectric constant higher than AlN may be used instead of the above-mentioned material. When the materials are used, a band pass filter having sufficient band width and low loss is established, compared to the case where an AlN piezoelectric film in which the element increasing the piezoelectric constant is not doped is used. The piezoelectric constant of a normal AlN piezoelectric film (piezoelectric strain constant) is 1.55 [$C/m^2$]. In the embodiment, the piezoelectric constant is increased to 3.0 [$C/m^2$], by doping the element increasing the piezoelectric constant.

The substrate 50 may be silicon (Si). An electrode film structuring the lower electrodes 62 and 82 and the upper electrodes 66 and 86 may be tungsten (W). The de-coupler film 70 may be silicon oxide ($SiO_2$). With the structure, the acoustic wave filters 40 and 41 have a pass band allowing passage of transmitting frequency band and receiving frequency band of the latter duplexer and establish a filter achieving low loss and high suppression.

Figure 5:
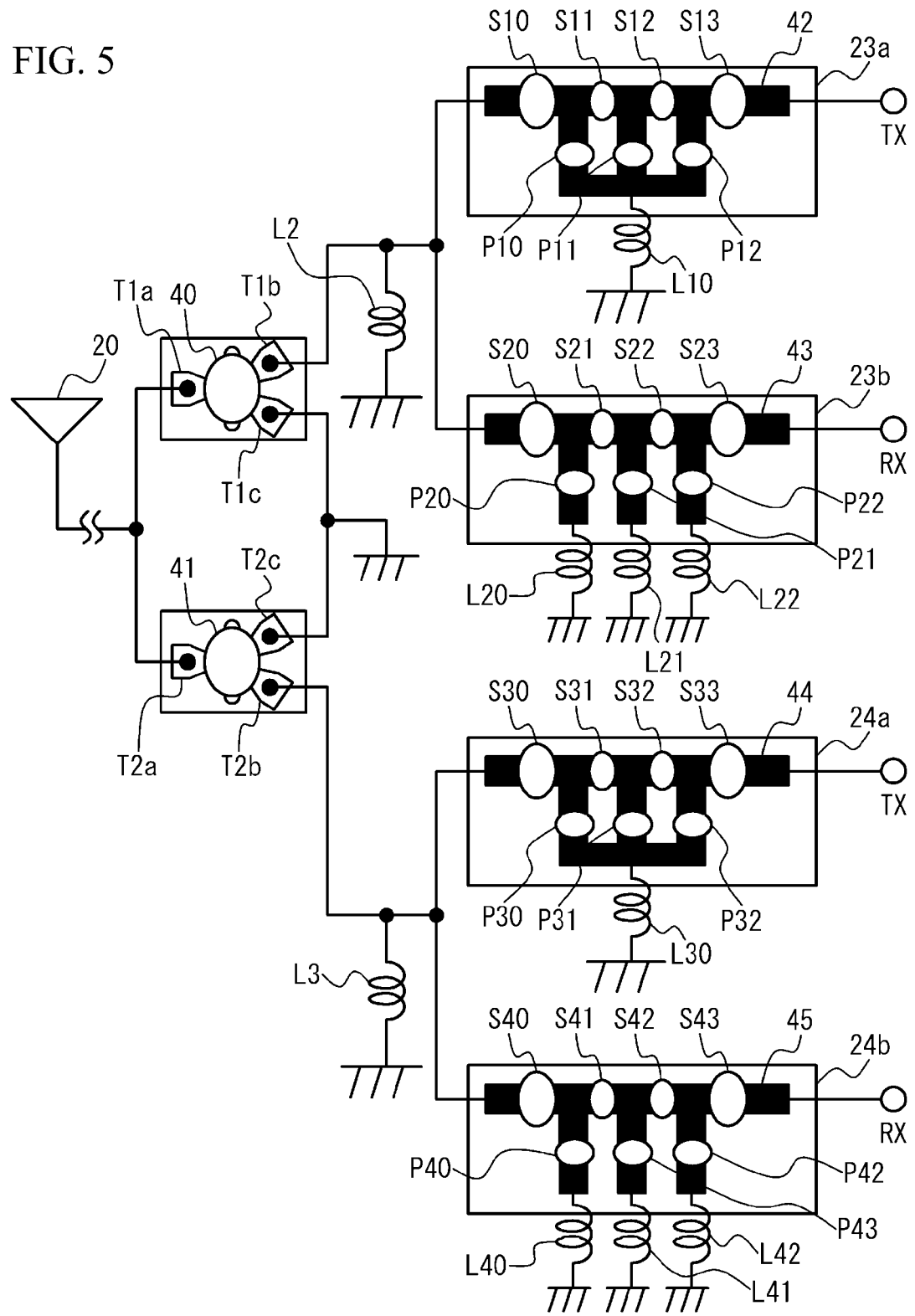
FIG. 5 illustrates a schematic top view of an acoustic wave filter and a duplexer.

FIG. 5 illustrates a schematic top view of the acoustic wave filters 40 and 41 and the duplexers 23 and 24 illustrated in FIG. 2, and corresponds to the circuit diagram of FIG. 3. The acoustic wave filters 40 and 41 are an acoustic wave filter having a CRF structure.

The acoustic wave filter 40 has three terminals T1a, T1b and T1c. The terminal T1a is a signal terminal on the side of antenna and corresponds to one of the first terminal 56 and the second terminal 54 of FIG. 4. The terminal T1b is a signal terminal on the side of internal circuit, and corresponds to the other of the first terminal 56 and the second terminal 54. The terminal T1c is a ground terminal and acts as a ground of FIG. 4.

The acoustic wave filter 40 is coupled to the ladder filter 23a on the side of transmitting and the ladder filter 23b on the side of receiving in the duplexer 23. The ladder filter 23a on the side of transmitting includes the series resonators S10 through S13 and the parallel resonators P10 through P12. A wiring 42 (actually including a lower electrode and an upper electrode) electrically couples each of the resonators. The ladder filter 23b on the side of receiving includes the series resonators S20 through S23 and the parallel resonators P20 through P22. A wiring 43 (actually including a lower electrode and an upper electrode) electrically couples each of the resonators. The matching circuit L2 is provided between the acoustic wave filter 40 and the ladder filters (23a and 23b). The series resonator and the parallel resonator structuring the ladder filter are structured with a FBAR.

The acoustic wave filter 41 has three terminals T2a, T2b and T2C. The terminal T2a is a signal terminal on the side of antenna and corresponds to one of the first terminal 56 and the second terminal 54 of FIG. 4. The terminal T2b is a signal terminal on the side of internal circuit, and corresponds to the other of the first terminal 56 and the second terminal 54. The terminal T2c is a ground terminal and acts as a ground of FIG. 4.

The acoustic wave filter 41 is coupled to the ladder filter 24a on the side of transmitting and the ladder filter 24b on the side of receiving in the duplexer 24. The ladder filter 24a on the side of transmitting includes the series resonators S30 through S33 and the parallel resonators P30 through P32. A wiring 44 (actually including a lower electrode and an upper electrode) electrically couples each of the resonators. The ladder filter 24b on the side of receiving includes the series resonators S40 through S43 and the parallel resonators P40 through P42. A wiring 45 (actually including a lower electrode and an upper electrode) electrically couples each of the resonators. The matching circuit L3 is provided between the acoustic wave filter 41 and the ladder filters (24a and 24b). The series resonator and the parallel resonator structuring the ladder filter are structured with a FBAR.

In the electronic circuit, an acoustic wave filter is used instead of a diplexer in a filter coupled between a duplexer and an antenna terminal. Reducing of size and height of an acoustic wave filter is easier than a diplexer of ceramics lamination type. Insertion loss of an acoustic wave filter is low. And, skirt characteristics of an attenuation curve of an acoustic wave filter are precipitous. In particular, when signals having a close frequency band are used in a Carrier Aggregation, it is easy to secure sufficient signal suppression in the frequency bands if the skirt characteristics are precipitous. And, the insertion loss of a whole filter may be reduced.

Figure 6A:
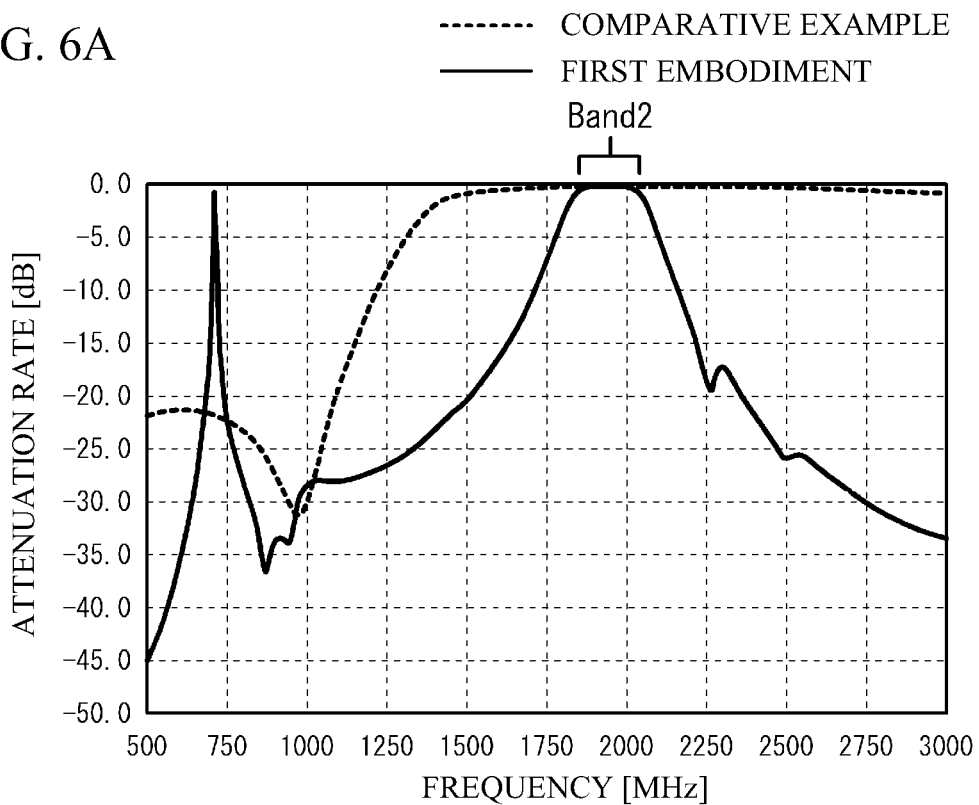
FIG. 6A and FIG. 6B illustrate filter characteristics of an acoustic wave filter and a diplexer.
Figure 6B:
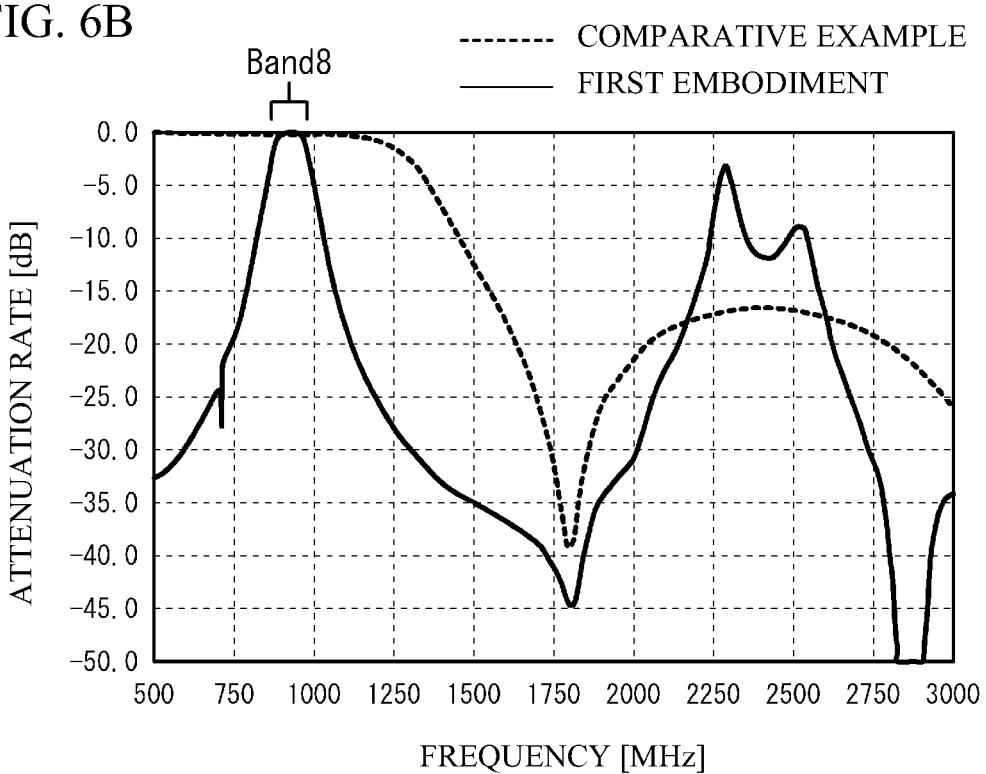

FIG. 6A and FIG. 6B illustrate a comparison of the filter characteristics obtained through a simulation between the acoustic wave filter in accordance with the first embodiment ("40" and "41" in FIG. 2) and the diplexer in accordance with the comparative example ("22" in FIG. 1). In the simulations of FIG. 6A through FIG. 9B, the CRF of FIG. 4 was used as an acoustic wave filter. In the first resonator 60 and the second resonator 80, the lower electrodes (62, 82) and the upper electrodes (66, 86) were tungsten (W). The thickness of the lower electrode 62 and the upper electrode 86 on the side of Band 2 was 170 nm. The thickness of the upper electrode 66 and the lower electrode 82 on the side of Band 2 was 380 nm. The thickness of the lower electrode 62 and the upper electrode 86 on the side of Band 8 was 260 nm. The thickness of the upper electrode 66 and the lower electrode 82 on the side of Band 8 was 730 nm. An AlN thin film of which piezoelectric constant was enlarged to 2.2 [$C/m^2$] by doping an element increasing the piezoelectric constant was used as the piezoelectric thin films 64 and 84. The thickness of the piezoelectric thin films 64 and 84 on the side of Band 2 was 810 nm. The thickness of the piezoelectric thin films 64 and 84 on the side of Band 8 was 1760 nm. The thickness of the de-coupler film 70 on the side of Band 2 was 380 nm. The thickness of the de-coupler film 70 on the side of Band 8 was 820 nm.

FIG. 6A illustrates filter characteristics on the side of Band 2. FIG. 6B illustrates filter characteristics on the side of Band 8. "Band 2" and "Band 8" in FIG. 6A and FIG. 6B indicate a pass band. A solid line indicates the characteristics of the acoustic wave filter (the first embodiment). A dotted line indicates the characteristics of the diplexer (the comparative example). As illustrated, the skirt characteristics of the acoustic wave filter is more precipitous than the diplexer. The acoustic wave filter is superior to the diplexer in the suppression around the pass band. The acoustic wave filters 40 and 41 are capable of suppressing both lower frequency side and higher frequency side and are superior to the diplexer in wide-band suppression, because the acoustic wave filters 40 and 41 are a band pass filter.

Figure 7A:
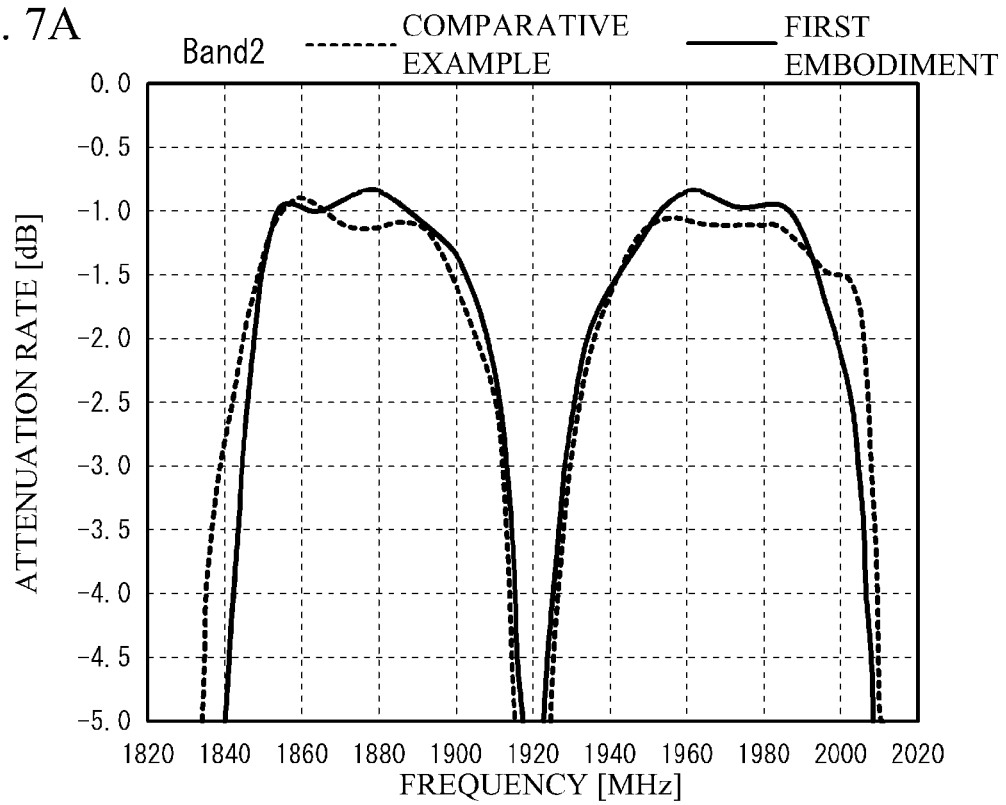
FIG. 7A and FIG. 7B illustrate band characteristics of a filter in which an acoustic wave filter and a duplexer are combined.
Figure 7B:
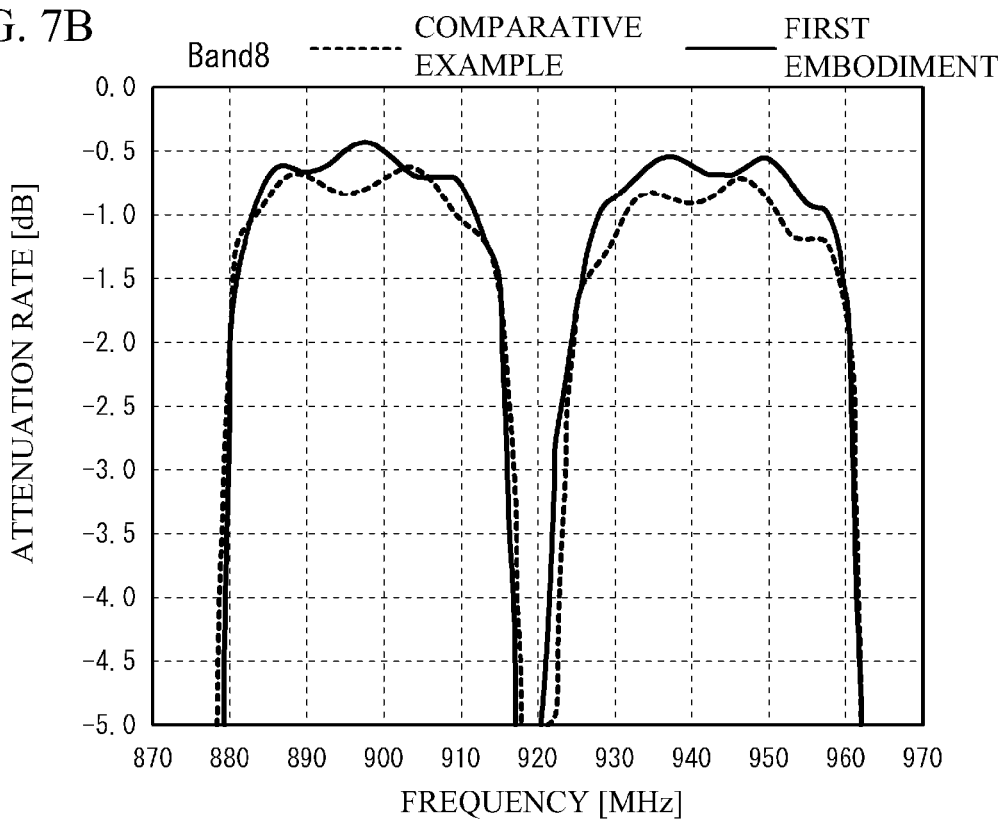

FIG. 7A and FIG. 7B illustrate band characteristics of a filter in which an acoustic wave filter and a duplexer are combined (a portion corresponding to the region 32 of FIG. 2). FIG. 7A illustrates filter characteristics on the side of Band 2. FIG. 7B illustrates filter characteristics on the side of Band 8. A solid line indicates filter characteristics of a filter (the first embodiment) in which an acoustic wave filter and a duplexer are combined. A dotted line indicates filter characteristics of a filer (the comparative example) in which a diplexer and a duplexer are combined. As illustrated, the loss of the filter of the first embodiment is lower than that of the filter of the comparative example by 0.2 to 0.4 dB.

Figure 8A:
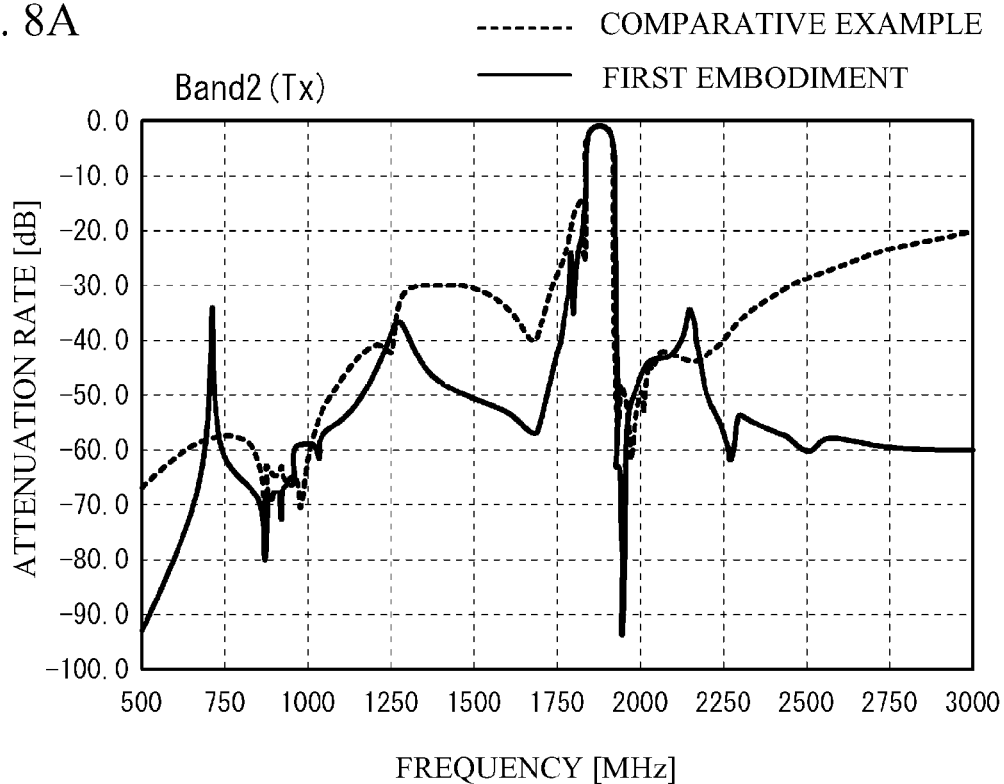
FIG. 8A and FIG. 8B illustrate wide-band characteristics of a filter in which an acoustic wave filter and a duplexer are combined.
Figure 8B:
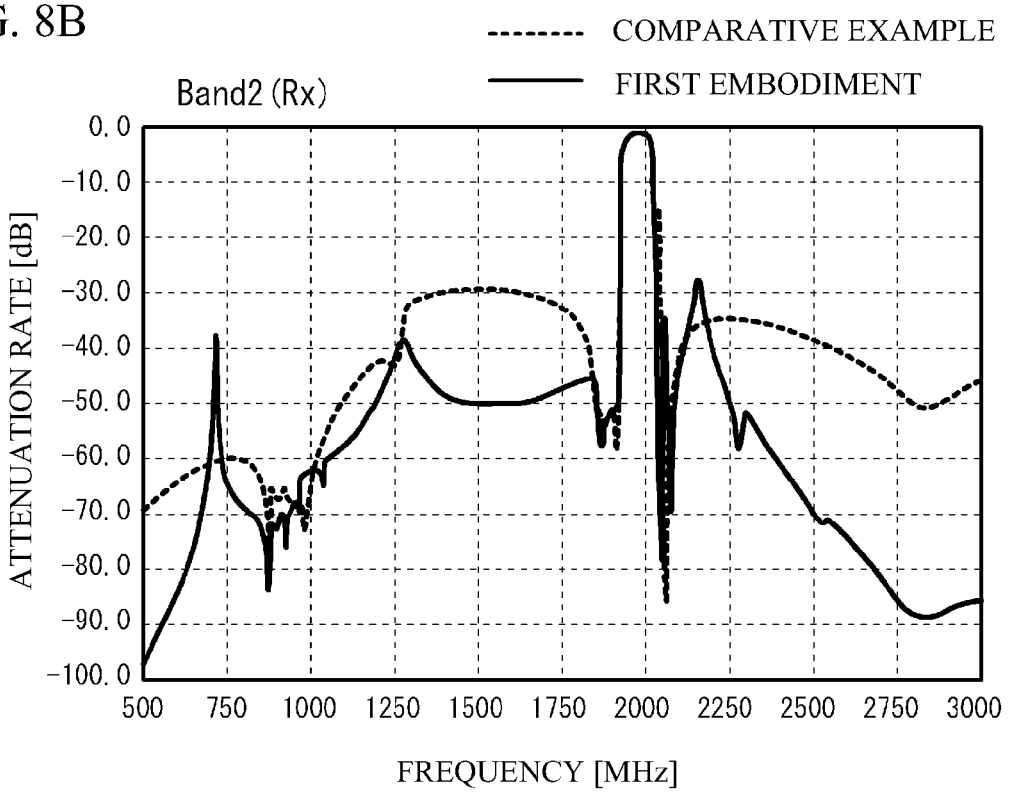
Figure 9A:
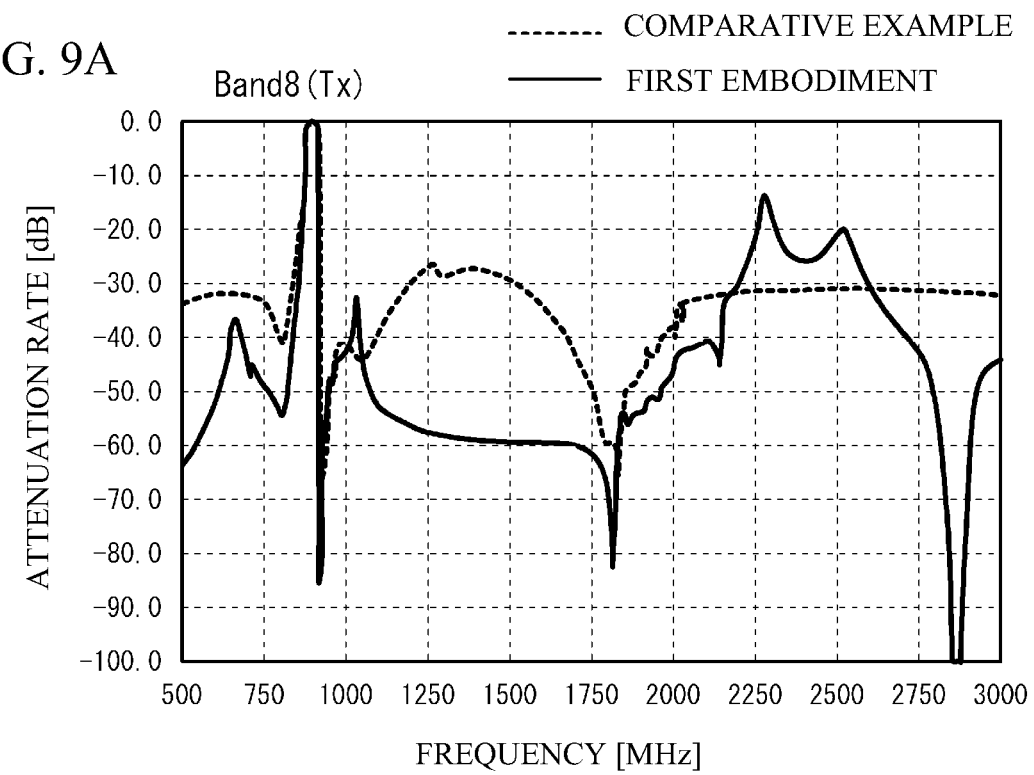
FIG. 9A and FIG. 9B illustrate wide-band characteristics of a filter in which an acoustic wave filter and a duplexer are combined.
Figure 9B:
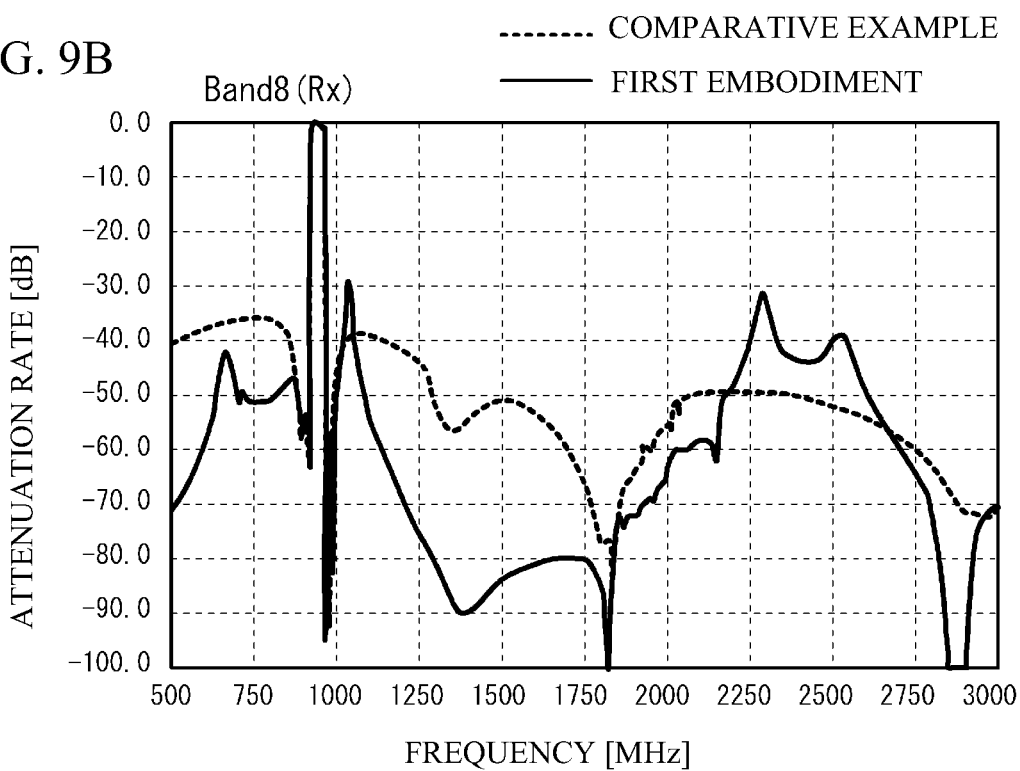

FIG. 8A through FIG. 9B illustrate wide-band characteristics of the above-mentioned filter. FIG. 8A illustrates the filter characteristics of the Band 2 on the side of transmitting (TX). FIG. 8B illustrates the filter characteristics of the Band 2 on the side of receiving (RX). FIG. 9A illustrates the filter characteristics of the Band 8 on the side of transmitting (TX). FIG. 9B illustrates the filter characteristics of the Band 8 on the side of receiving (RX). A solid line indicates the characteristics of the filter (the first embodiment) in which an acoustic wave filter and a duplexer are combined. A dotted line indicates the characteristics of the filter (the comparative example) in which a diplexer and a duplexer are combined. As illustrated, the filter of the first embodiment is superior to the filter of the comparative example in wide-band suppression. Generally, loss in a band and wide-band suppression have a trade-off relationship. With respect to the filter having sufficient wide-band suppression as the first embodiment, it is possible to reduce the insertion loss more by reducing the loss of the filter characteristics.

As mentioned above, with the electronic circuit in accordance with the first embodiment, the insertion loss is restrained, and filter characteristics that are superior in the wide-band suppression are obtained. When the above-mentioned electronic circuit is provided in electronic modules such as a mobile phone, downsizing and high performance of the electronic modules are achieved.

Figure 10A:
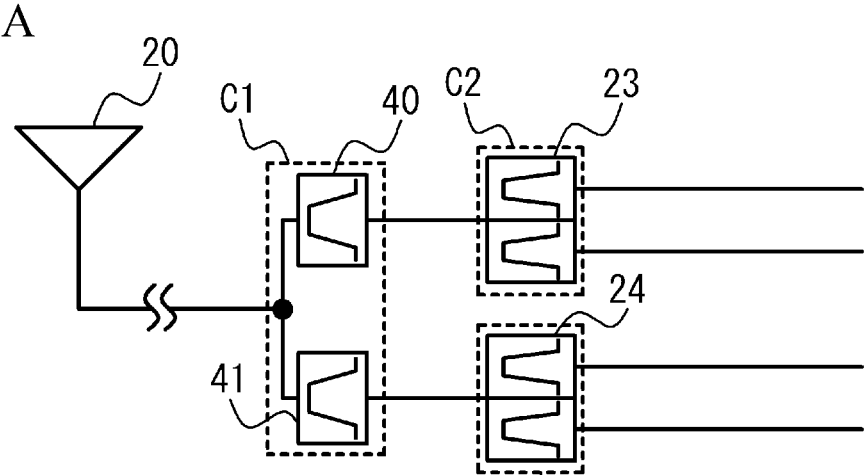
FIG. 10A through FIG. 10C illustrate a schematic view of an acoustic wave filter and a duplexer.
Figure 10B:
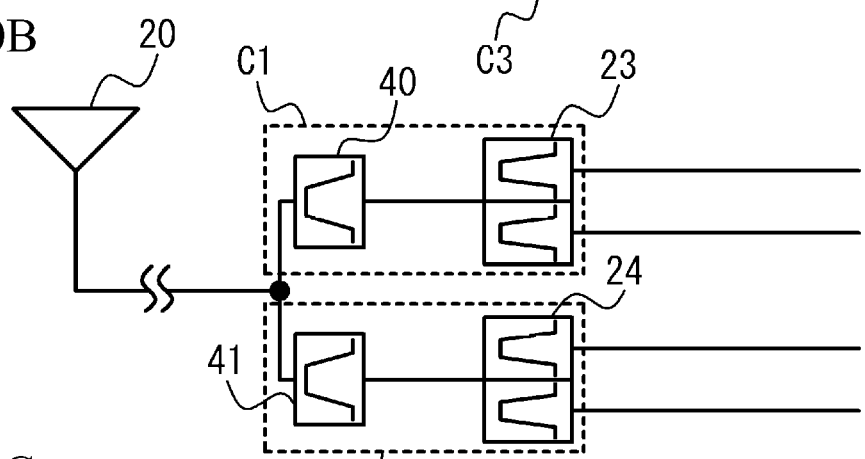
Figure 10C:
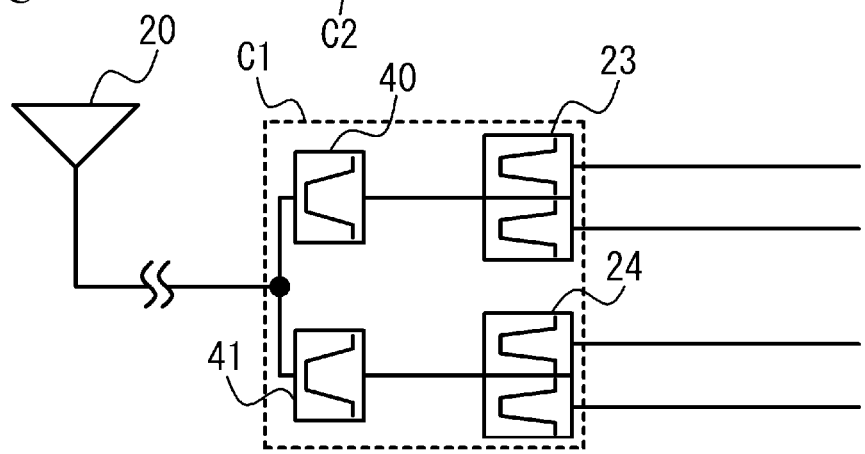

FIG. 10A through FIG. 10C illustrate a schematic view of the acoustic wave filter and the duplexer in the region 32 of FIG. 2. The diplexer 21 between the acoustic wave filters 40 and 41 and the second antenna terminal 20 is omitted. In FIG. 10A, the acoustic wave filters 40 and 41 are sealed in a single package C1 and are integrated. Other duplexers 23 and 24 are sealed in a package C2 and another package C3 separately. In FIG. 10B, the acoustic wave filter 40 and the duplexer 23 coupled to the acoustic wave filter 40 are sealed in a single package C1 and are integrated. And, the acoustic wave filter 41 and the duplexer 24 coupled to the acoustic wave filter 41 are sealed in a single package C2 and are integrated. In FIG. 10C, the acoustic wave filters 40 and 41 and the duplexers 23 and 24 are sealed in a single package C1 and are integrated. In this way, a filter circuit of the region 32 in the high frequency wave circuit in FIG. 2 is structured with various mounting methods.

Figure 11:
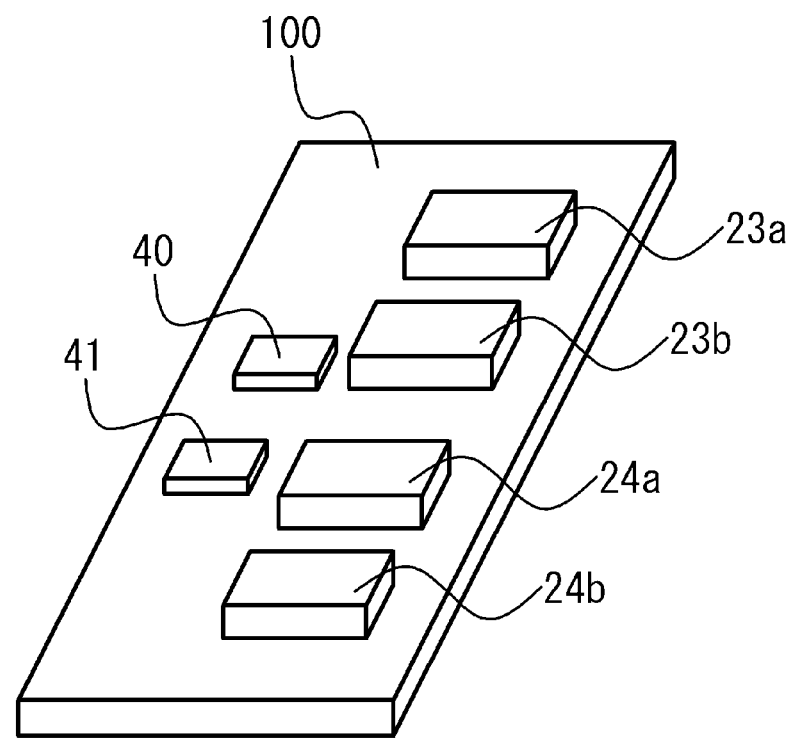
FIG. 11 illustrates a perspective view of an electronic module in accordance with the first embodiment.

FIG. 11 illustrates a perspective view of an electronic module on which the electronic circuit in accordance with the first embodiment (FIG. 2 and FIG. 5) is mounted. As illustrated in FIG. 11, the acoustic wave filters 40 and 41 and the duplexers 23a, 23b, 24a and 24b are packed and are mounted on an upper face of the printed substrate 100. In FIG. 11, the acoustic wave filter and the duplexer are packed separately. The acoustic wave filter and the duplexer may be integrated as illustrated in FIG. 10A through FIG. 10C.

Second Embodiment

A second embodiment is an example of a filter using a plate wave instead of the CRF as the acoustic wave filters 40 and 41.

Figure 12A:
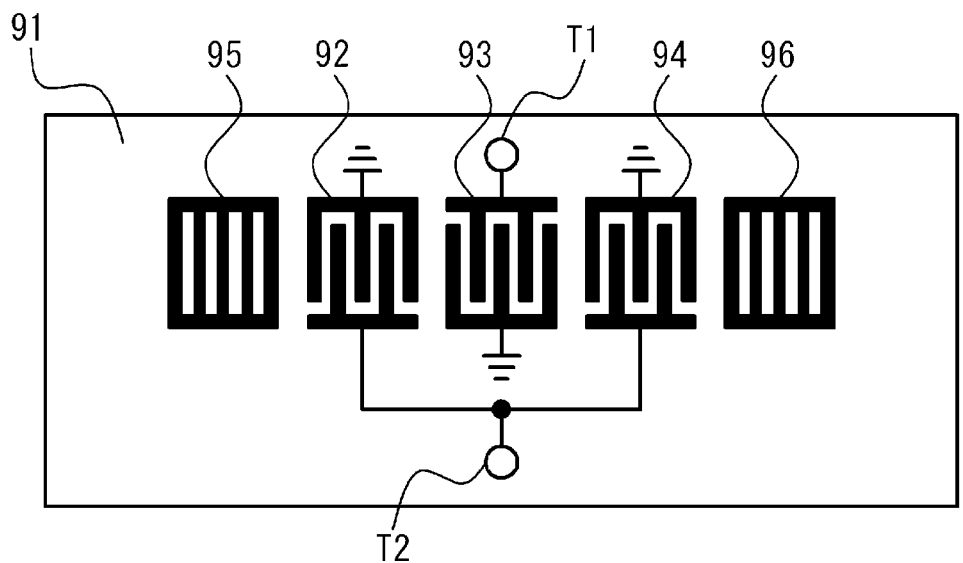
FIG. 12A and FIG. 12B illustrate a schematic view of an acoustic wave filter using a plate wave.
Figure 12B:
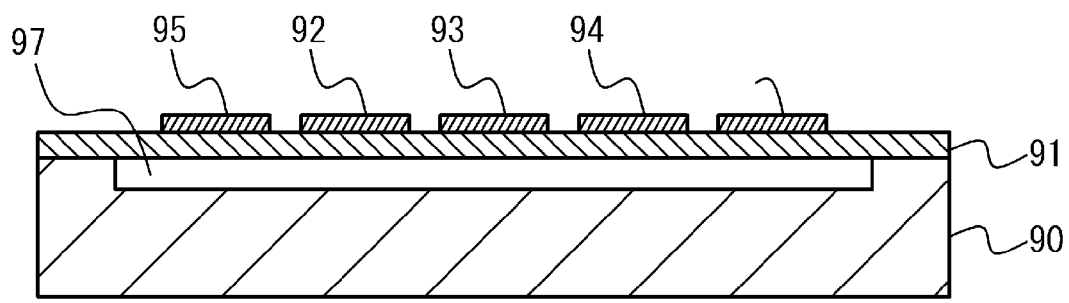

FIG. 12A and FIG. 12B illustrate a schematic top view and a schematic cross sectional view of an acoustic wave filter in accordance with the second embodiment. A piezoelectric thin film 91 is provided on a substrate 90. The piezoelectric thin film 91 may be made by physical vapor deposition such as a sputtering, or by reducing thickness of a piezoelectric single crystal substrate. Comb electrodes 92 through 94 and reflection electrodes 95 and 96 are provided on the piezoelectric thin film 91. The comb electrodes 92 through 94 and the reflection electrodes 95 and 96 are arrayed in a propagation direction of an acoustic wave. A void 97 is formed between the substrate 90 and the piezoelectric thin film 91 below the region in which the comb electrodes 92 through 94 and the reflection electrode 95 and 96 are provided.

One of edges of the comb electrode 93 arranged at a center is coupled to the first terminal T1. The other is grounded. One of edges of the comb electrodes 92 and 94 provided on the both sides of the comb electrode 93 is coupled to the second terminal T2 in common. The other is grounded. The acoustic wave filter in accordance with the second embodiment is an acoustic wave filter using a plate wave. The plate wave is one of bulk waves. Lamb wave and SH wave are included in the plate wave. It is possible to select the lamb wave or the SH wave by adjusting a direction of a cut face of a piezoelectric single crystal (the piezoelectric thin film 91) of the acoustic wave filter in accordance with the second embodiment. For example, when the lamb wave is used, $LiNbO_3$ or the like achieving Z-cut and X-propagation can be used. When the SH wave is used, $LiTaO_3$ or the like achieving 42 degrees Y-cut and X propagation can be used. The acoustic wave filter in accordance with the second filter can use both the lamb wave and the SH wave.

With the electronic circuit in accordance with the second embodiment, it is possible to restrain the insertion loss and achieve filter characteristics having superior wide-band suppression. When the above-mentioned electronic circuit is provided in various electronic modules such as a mobile phone, downsizing and high performance of the electronic modules are achieved. In this way, even if a filter having the acoustic wave filters 40 and 41 using the plate wave is used, a filter having a pass band allowing frequencies for transmitting and receiving of a latter duplexer and achieving low loss and high suppression is established.

In the first and second embodiment, a band pass filter is used as the acoustic wave filters 40 and 41. A diplexer in which a high pass filter and a low pass filter are combined is capable of suppressing only one of high frequency side and low frequency side. In contrast, a band pass filter is capable of suppressing both high frequency side and low frequency side.

Therefore, the band pass filter is superior in wide-band suppression. A Q value of the band pass filter is higher than that of the diplexer. Therefore, the skirt characteristics of the attenuation curve of the band pass filter are precipitous. Therefore, the band pass filter is adequate for a case where two close frequency bands are used in Carrier Aggregation.

In the first and second embodiments, a double mode filter is used as the acoustic wave filters 40 and 41. A DMS (Double Mode SAW Filter), a CRF and or the like may be used as the double mode filter. The double mode filter is superior in wide-band suppression. Therefore, the insertion loss is reduced when the loss is reduced. In this way, when a double mode filter is used as the acoustic wave filters 40 and 41, a filter having a pass band allowing frequencies for transmitting and receiving of a latter duplexer and achieving low loss and high suppression is established.

In the first and second embodiment, an acoustic wave filter using a bulk wave is used as the acoustic wave filters 40 and 41. The acoustic wave filter is a filter using a surface acoustic wave (SAW filter or the like) or a filter using a bulk wave (FBAR, CRF, plate wave filter or the like). The filter using a surface acoustic wave uses a micro electrode pattern for IDT (Interdigital Transducer). Therefore, power durability of the filter using a surface acoustic wave is low, and the filter is not adequate to a communication using a high power signal. In contrast, the FBAR and the CRF (FIG. 4) are superior in the power durability, because the FBAR and the CRF do not use the micro electrode pattern. The plate wave filter (FIG. 12A and FIG. 12B) is a filter using an IDT (comb electrode). A propagation speed of the plate wave is higher than that of the acoustic wave. Therefore, a comb width of the IDT may be enlarged. And the plate filter is superior to the SAW filter in the power durability. In this way, when the acoustic wave filter using the bulk wave is used as the acoustic wave filers 40 and 41, a filter that is superior in the power durability and is adequate to a high power signal communication is established.

In the first and second embodiments, the duplexer provided behind the acoustic wave filter is a ladder type filter (FIG. 3). Another type filter such as a lattice type or a double mode may be used. The number of the resonators in the ladder type is not limited to the case of FIG. 3. In the first embodiment, shunt inductors L1, L2 and L3 are used for a matching circuit in the duplexer. However, the matching circuit may be structured with another circuit such as a λ/4 line. The matching circuit is not needed, when the impedance can be optimized by filter design.

The electronic circuits of the first and second embodiments can be applied to various high frequency circuits, and are preferable for Carrier Aggregation communicating with use of a plurality of carriers having a different frequency band.

The present invention is not limited to the specifically described embodiments, but other embodiments and variations may be made without departing from the scope of the claimed invention.

What is claimed is:

1. An electronic circuit comprising:
   a plurality of duplexers that are coupled to an antenna terminal and have a pass band different from each other; and
   a plurality of acoustic wave filters that are respectively coupled between the antenna terminal and the plurality of the duplexers, the plurality of acoustic wave filters including a first acoustic wave filter and a second acoustic wave filter,
   wherein filter characteristics of the first acoustic wave filter of the plurality of the acoustic wave filters are set so as to allow passage of a signal in both a pass band for transmitting and a pass band for receiving of a first duplexer of the plurality of the duplexers that is coupled to the first acoustic wave filter and suppress passage of a signal in both a pass band for transmitting and a pass band for receiving of a second duplexer of the plurality of the duplexers that is different from the first duplexer and that is coupled to the second acoustic wave filter;
   each of the first acoustic wave filter and the second acoustic wave filter is a band pass filter; and
   a frequency band included in a pass band of the first acoustic wave filter and a frequency band included in a pass band of the second acoustic wave filter are used for Carrier Aggregation.

2. The electronic circuit as claimed in claim 1, wherein at least one of the first acoustic wave filter and the second acoustic wave filter is a double mode filter.

3. The electronic circuit as claimed in claim 1, wherein at least one of the first acoustic wave filter and the second acoustic wave filter is a filter using a bulk wave.

4. The electronic circuit as claimed in claim 1, wherein at least one of the first acoustic wave filter and the second acoustic wave filter is a CRF (Coupled Resonator Filter) having a piezoelectric thin film.

5. The electronic circuit as claimed in claim 4, wherein the piezoelectric thin film is aluminum nitride including an element increasing piezoelectric constant.

6. The electronic circuit as claimed in claim 1, wherein at least one of the first acoustic wave filter and the second acoustic wave filter uses a plate wave.

7. An electronic module comprising an electronic circuit that includes:
   a plurality of duplexers that are coupled to an antenna terminal and have a pass band different from each other; and
   a plurality of acoustic wave filters that are respectively coupled between the antenna terminal and the plurality of the duplexers, the plurality of acoustic wave filters including a first acoustic wave filter and a second acoustic wave filter,
   wherein:
   filter characteristics of the first acoustic wave filter of the plurality of the acoustic wave filters are set so as to allow passage of a signal in both a pass band for transmitting and a pass band for receiving of a first duplexer of the plurality of the duplexers that is coupled to the first acoustic wave filter and suppress passage of a signal in both a pass band for transmitting and a pass band for receiving of a second duplexer of the plurality of the duplexers that is different from the first duplexer and that is coupled to the second acoustic wave filter; and
   each of the first acoustic wave filter and the second acoustic wave filter is a band pass filter.

8. The electronic module as claimed in claim 7, wherein a frequency band included in a pass band of the first acoustic wave filter and a frequency band included in a pass band of the second acoustic wave filter are used for Carrier Aggregation.

9. The electronic module as claimed in claim 7, wherein at least one of the first acoustic wave filter and the second acoustic wave filter is a double mode filter.

10. The electronic module as claimed in claim 7, wherein at least one of the first acoustic wave filter and the second acoustic wave filter is a filter using a bulk wave.

11. The electronic module as claimed in claim 7, wherein at least one of the first acoustic wave filter and the second acoustic wave filter is a CRF (Coupled Resonator Filter) having a piezoelectric thin film.

12. The electronic module as claimed in claim 11, wherein the piezoelectric thin film is aluminum nitride including an element increasing piezoelectric constant.

13. The electronic module as claimed in claim 7, wherein at least one of the first acoustic wave filter and the second acoustic wave filter uses a plate wave.

* * * * *